(12) United States Patent
Kong et al.

(10) Patent No.: US 12,096,645 B2
(45) Date of Patent: Sep. 17, 2024

(54) DISPLAY APPARATUS

(71) Applicant: LG Display Co., Ltd., Seoul (KR)

(72) Inventors: Min-Suk Kong, Paju-si (KR); Mi-Rae Lee, Paju-si (KR); Young-Jun Jeon, Paju-si (KR); Myung-Woo Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 16 days.

(21) Appl. No.: 17/974,450

(22) Filed: Oct. 26, 2022

(65) Prior Publication Data

US 2023/0209866 A1  Jun. 29, 2023

(30) Foreign Application Priority Data

Dec. 27, 2021 (KR) .................. 10-2021-0188231

(51) Int. Cl.
| | | |
|---|---|---|
| *G06F 3/041* | (2006.01) | |
| *H10K 50/84* | (2023.01) | |
| *H01L 25/16* | (2023.01) | |
| *H10K 59/12* | (2023.01) | |

(52) U.S. Cl.
CPC ............. *H10K 50/84* (2023.02); *G06F 3/041* (2013.01); *G06F 2203/04107* (2013.01); *H01L 25/167* (2013.01); *H10K 59/12* (2023.02)

(58) Field of Classification Search
CPC ........ H10K 50/84; H10K 59/12; G06F 3/041; G06F 2203/04107
See application file for complete search history.

(56) References Cited

U.S. PATENT DOCUMENTS

| | | | |
|---|---|---|---|
| 2013/0154949 A1* | 6/2013 | Jamshidi Roudbari | ...................... G06F 3/0412 349/110 |
| 2014/0285953 A1* | 9/2014 | Hirai | ...................... G06F 1/1637 361/679.01 |
| 2015/0155347 A1* | 6/2015 | Baek | ...................... H10K 59/126 257/40 |
| 2017/0006702 A1* | 1/2017 | Park | ...................... H05K 1/092 |
| 2017/0075492 A1* | 3/2017 | Kim | ...................... G06F 3/0418 |
| 2018/0005568 A1* | 1/2018 | Kim | ...................... H10K 77/111 |
| 2018/0095566 A1* | 4/2018 | Lee | ...................... H10K 71/00 |
| 2018/0120998 A1* | 5/2018 | Jeong | ...................... G06F 3/0445 |
| 2018/0150170 A1* | 5/2018 | Oh | ...................... H10K 71/80 |
| 2019/0369787 A1* | 12/2019 | Park | ...................... G06F 3/0443 |
| 2019/0386251 A1* | 12/2019 | Erickson | ...................... H10K 50/858 |
| 2021/0200381 A1* | 7/2021 | Kang | ...................... B32B 27/306 |
| 2021/0328171 A1* | 10/2021 | Wang | ...................... H10K 50/8428 |
| 2022/0093692 A1* | 3/2022 | Li | ...................... G06F 1/1637 |

FOREIGN PATENT DOCUMENTS

| | | |
|---|---|---|
| KR | 10-2016-0076688 A | 7/2016 |
| KR | 10-2017-0035698 A | 3/2017 |

\* cited by examiner

*Primary Examiner* — Temesghen Ghebretinsae
*Assistant Examiner* — Sosina Abebe
(74) *Attorney, Agent, or Firm* — Fenwick & West LLP

(57) ABSTRACT

A display apparatus comprises a display panel for displaying an image, a touch sensor above the display panel, at least one opening formed in the touch sensor, and a shielding member formed in the touch sensor to cover the opening.

11 Claims, 6 Drawing Sheets

DISPLAY APPARATUS

CROSS-REFERENCE TO RELATED APPLICATION

This application claims priority to and the benefit of Korean Patent Application No. 10-2021-0188231, filed on Dec. 27, 2021, the disclosure of which is incorporated herein by reference in its entirety.

BACKGROUND

1. Technical Field

The present invention relates to a display apparatus capable of preventing color fading of a polarizing plate.

2. Discussion of the Related Art

With the development of information technology, various types of small and thin display apparatus such as a liquid crystal display apparatus, an organic light emitting display apparatus, a plasma display apparatus, a micro LED display apparatus, etc. have been studied. Further, these display apparatus are applied to various electronic devices such as a smart phone or a tablet PC.

In particular, an on-cell display apparatus in which a touch sensor for recognizing a user's touch is disposed on an upper portion of a display panel has been recently introduced.

However, the on-cell display apparatus has the following problems. In an on-cell display apparatus, since cracks are generated during trimming process of the display apparatus, a plurality of crack blocking holes should be formed in an insulating layer to prevent the propagation of these cracks through the insulating layer of the touch sensor. However, these crack blocking holes serve as passages for gas or moisture generated during the reliability test, and the gas and moisture reach the polarizing plate through these passages. As a result, the color of the polarizing plate is faded and thus the quality of the image is deteriorated.

SUMMARY

An object of the present invention is to provide a display apparatus capable of preventing peeling and color fading of a polarizing plate by providing a shielding means for shielding gas and moisture flowing in through a crack preventing hole in a touch sensor.

The display apparatus comprises a display panel for displaying an image, a touch sensor disposed above the display panel, at least one opening formed in the touch sensor, and a shielding member formed in the touch sensor to cover the opening.

The touch sensor includes a buffer layer over the display panel, a bridge on the buffer layer, an interlayer insulating layer on the bridge, a first touch electrode and a second touch electrode on the interlayer insulating layer, and a passivation layer over the first touch electrode and the second touch electrode.

The opening is formed in the buffer layer and the interlayer insulating layer and the shielding member is disposed over the passivation layer. The shielding member may include a tape attached on an upper surface of the passivation layer and the tape may be made of Al. The shielding member may include a metal pattern formed on the upper surface of the passivation layer.

The shielding member may be the metal pattern formed on the interlayer insulating layer and made of the same metal as the first touch electrode and the second touch electrode.

The opening is disposed along an edge of the touch sensor and the shielding member is disposed along the edge of the touch sensor to shield the opening.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
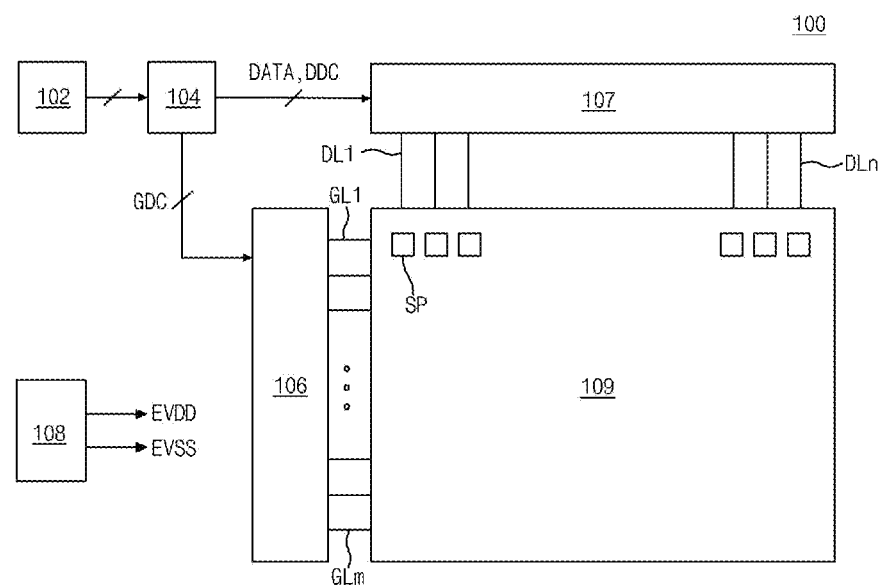
FIG. 1 is a schematic block diagram of a display apparatus according to the present invention.

Advantages and features of the present disclosure and methods for achieving them will be made clear from embodiments described in detail below with reference to the accompanying drawings. The present disclosure may, however, be implemented in many different forms and should not be construed as being limited to the embodiments set forth herein, and the embodiments are provided such that this disclosure will be thorough and complete and will fully convey the scope of the present disclosure to those skilled in the art to which the present disclosure pertains, and the present disclosure is defined only by the scope of the appended claims.

Shapes, sizes, ratios, angles, numbers, and the like disclosed in the drawings for describing the embodiments of the present disclosure are illustrative, and thus the present disclosure is not limited to the illustrated matters. The same reference numerals refer to the same components throughout this disclosure. Further, in the following description of the present disclosure, when a detailed description of a known related art is determined to unnecessarily obscure the gist of the present disclosure, the detailed description thereof will be omitted herein. When terms such as "including," "having," "comprising," and the like mentioned in this disclosure are used, other parts may be added unless the term "only" is used herein. When a component is expressed as being singular, being plural is included unless otherwise specified.

In analyzing a component, an error range is interpreted as being included even when there is no explicit description.

In describing a positional relationship, for example, when a positional relationship of two parts is described as being "on," "above," "below," "next to," or the like, unless "immediately" or "directly" is used, one or more other parts may be located between the two parts.

In describing a temporal relationship, for example, when a temporal predecessor relationship is described as being "after," "subsequent," "next to," "prior to," or the like, unless "immediately" or "directly" is used, cases that are not continuous may also be included.

Although the terms first, second, and the like are used to describe various components, these components are not substantially limited by these terms. These terms are used only to distinguish one component from another component. Therefore, a first component described below may substantially be a second component within the technical spirit of the present disclosure.

Each feature of the various embodiments of the present invention may be partially or wholly combined with each other, technically various interlocking and driving are possible, and each of the embodiments may be implemented independently of each other or may be implemented together in a related relationship.

Hereinafter, the present invention will be described in detail accompanying drawings.

The present invention can be applied to various display apparatus. For example, the display apparatus of the present invention may be applied to display apparatus such as an organic light emitting display apparatus, a liquid crystal display apparatus, an electrophoretic display apparatus, a quantum dot display apparatus, a micro LED (Light Emitting Diode) display apparatus, and a mini LED display apparatus. However, in the following description, the organic light emitting display apparatus will be described as an example for convenience of description. The display panel of the present invention may include an organic light emitting display panel, a liquid crystal display panel, a mini LED (Light Emitting Diode) panel, and a micro LED panel.

Figure 2:
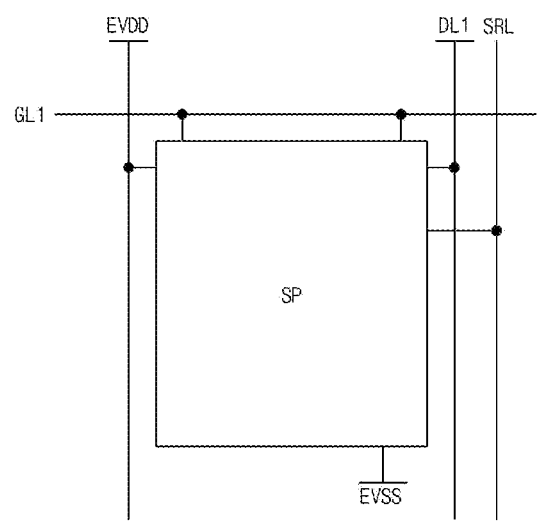
FIG. 2 is the schematic block diagram of a sub-pixel shown in FIG. 1.

FIG. 1 is the schematic block diagram and FIG. 2 is the schematic block diagram of the sub-pixel SP of the organic light emitting display apparatus according to this invention.

As shown in FIG. 1, the organic light emitting display apparatus 100 includes an image processing unit 102, a timing controlling unit 104, a gate driving unit 106, a data driving unit 107, a power supplying unit 108, and a display panel 109.

The image processing unit 102 outputs an image data supplied from outside and a driving signal for driving various devices. For example, the driving signal from the image processing unit 102 can include a data enable signal, a vertical synchronizing signal, a horizontal synchronizing signal, and a clock signal.

The image data and the driving signal are supplied to the timing controlling unit 104 from the image processing unit 102. The timing controlling unit 104 writes and outputs gate timing controlling signal GDC for controlling the driving timing of the gate driving unit 106 and data timing controlling signal DDC for controlling the driving timing of the data driving unit 107 based on the driving signal from the image processing unit 102.

The gate driving unit 106 outputs the scan signal to the display panel 109 in response to the gate timing control signal GDC supplied from the timing controlling unit 104. The gate driving unit 106 outputs the scan signal through a plurality of gate lines GL1 to GLm. In this case, the gate driving unit 106 may be formed in the form of an integrated circuit (IC), but is not limited thereto.

The data driving unit 107 outputs the data voltage to the display panel 109 in response to the data timing control signal DDC input from the timing controlling unit 104. The data driving unit 107 samples and latches the digital data signal DATA supplied from the timing controlling unit 104 to convert it into the analog data voltage based on the gamma voltage. The data driving unit 107 outputs the data voltage through the plurality of data lines DL1 to DLn. In this case, the data driving unit 107 may be mounted on the upper surface of the display panel 109 in the form of an integrated circuit (IC), but is limited thereto.

The power supplying unit 108 outputs a high potential voltage VDD and a low potential voltage VSS etc. to supply these to the display panel 109. The high potential voltage VDD is supplied to the display panel 109 through the first power line EVDD and the low potential voltage VSS is supplied to the display panel 109 through the second power line EVSS. In this time, the voltage from the power supplying unit 108 is applied to the data driving unit 107 or the gate driving unit 106 to drive thereto.

The display panel 109 displays the image based on the data voltage from the data driving unit 107, the scan signal from the gate driving unit 106, and the power from the power supplying unit 108.

The display panel 109 includes a plurality of sub-pixels SP to display the image. The sub-pixel SP can include Red sub-pixel, Green sub-pixel, and Blue sub-pixel. Further, the sub-pixel SP can include White sub-pixel, the Red sub-pixel, the Green sub-pixel, and the Blue sub-pixel. The White sub-pixel, the Red sub-pixel, the Green sub-pixel, and the Blue sub-pixel may be formed in the same area or may be formed in different areas.

As shown in FIG. 2, one sub-pixel SP may be connected to the gate line GL1, the data line DL1, the first power line EVDD, the second power line EVSS, and the sensing voltage readout line SRL. The number of transistors, capacitors and the driving method of the sub-pixel SP are determined according to the circuit configuration.

Figure 3:
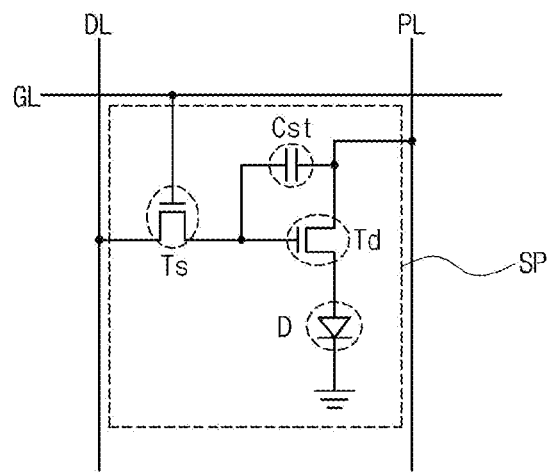
FIG. 3 is a circuit diagram conceptually illustrating the sub-pixel of an organic light emitting display apparatus according to the present invention.

FIG. 3 is the circuit diagram illustrating the sub-pixel SP of the organic light emitting display apparatus 100 according to the present invention.

As shown in FIG. 3, the organic light emitting display apparatus 100 according to the present invention includes the gate line GL, the data line DL, and the power line PL crossing each other for defining the sub-pixel SP. A switching thin film transistor Ts, a driving thin film transistor Td, a storage capacitor Cst, and an organic light emitting device D are disposed in the sub-pixel SP.

The switching thin film transistor Ts is connected to the gate line GL and the data line DL, and the driving thin film transistor Td and the storage capacitor Cst are connected between the switching thin film transistor Ts and the power line PL. The organic light emitting device D is connected to the driving thin film transistor Td.

In the organic light emitting display apparatus having this structure, when the switching thin film transistor Ts is turned on according to the gate signal applied to the gate line GL, the data signal applied to the data line DL is applied to the gate electrode of the driving thin film transistor Td and one electrode of the storage capacitor Cst through the switching thin film transistor Ts.

The driving thin film transistor Td is turned on according to the data signal applied to the gate electrode. As a result, the current proportional to the data signal is supplied to the organic light emitting device D from the power line PL through the driving thin film transistor Td and then the organic light emitting device D emits light with a luminance proportional to the current flowing through the driving thin film transistor Td.

At this time, the storage capacitor Cst is charged with the voltage proportional to the data signal to keep the voltage of the gate electrode of the driving thin film transistor Td constant for one frame.

In the figure, only two thin film transistors Td and Ts and one capacitor Cst are provided, but the present invention is not limited thereto. Three or more thin film transistors and two or more capacitors may be provided in the present invention.

Figure 4:
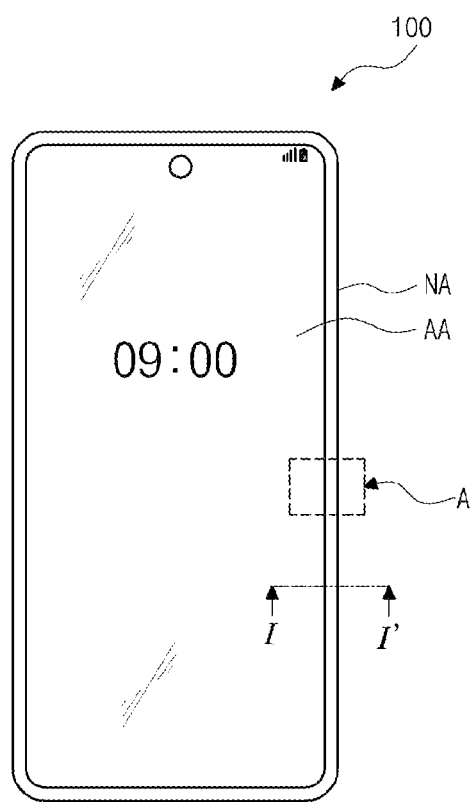
FIG. 4 is a plan view schematically illustrating the display apparatus according to a first embodiment of the present invention.

FIG. 4 is a plan view schematically illustrating the display apparatus 100 according to the first embodiment of the present invention.

As shown in FIG. 4, the display apparatus 100 according to the first embodiment of the present invention is divided into a display area AA in which the image is displayed and a non-display area NA formed outside the display area AA.

The display area AA is the area in which the actual image is displayed. A plurality of sub-pixels are arranged in a matrix in the display area AA. The non-display area NA is formed outside the display area AA, and various driving devices and wires for applying the signal to the display area AA are disposed in the non-display area NA.

For process efficiency, a plurality of display apparatus 100 are formed on a large area mother substrate and then processed to separate it into individual display apparatus 100. Further, as shown in figure, since the corners of the display apparatus 100 has a round shape, the separated display apparatus 100 must also be processed for the round shape.

The display apparatus 100 is processed by a laser or a cutting wheel. However, when the display apparatus 100 is processed by the laser or the cutting wheel, an impact is applied to the cut side end surface, and this impact causes cracks inside the display apparatus 100.

The crack may be generated in various layers. The crack may be generated in the encapsulation layer inside the display apparatus 100 or in the insulating layer inside the touch sensor.

In the display apparatus 100 according to the first embodiment of the present invention, the crack generated at the cut surface can be blocked, which will be described in more detail below.

Figure 5:
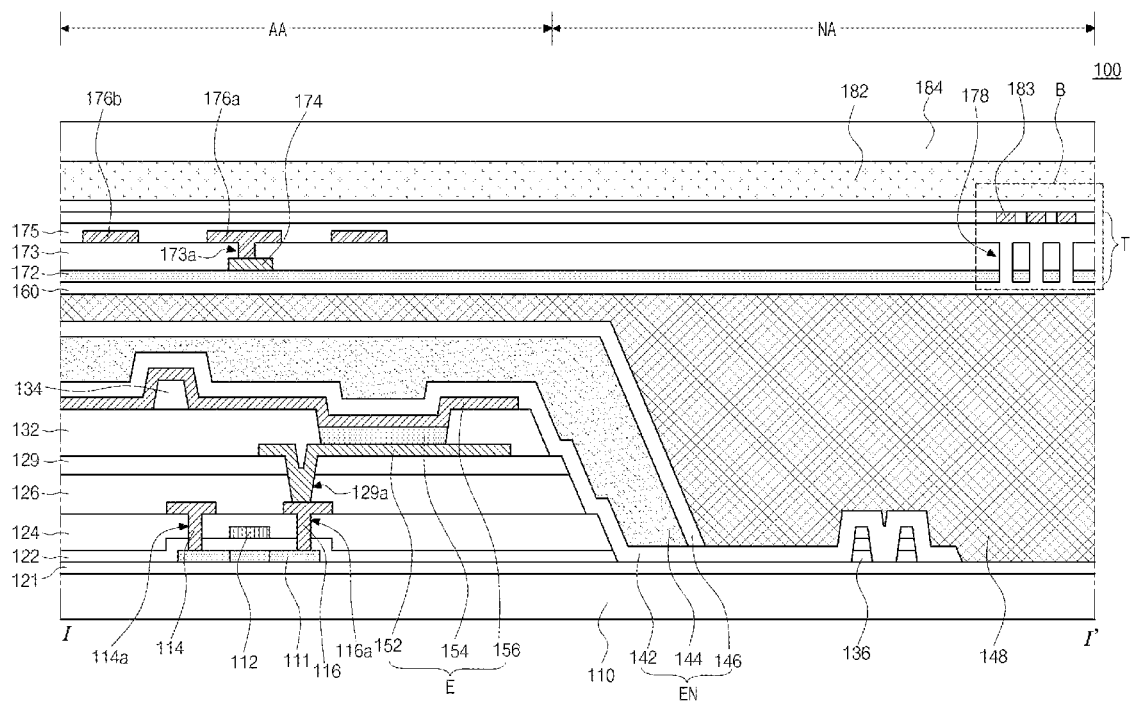
FIG. 5 is a cross-sectional view taken along line I-I" of FIG. 4.

FIG. 5 is the cross-sectional view taken along line I-I' of FIG. 4.

As shown in FIG. 5, the first substrate 110 includes the display area AA and the non-display area NA.

A first buffer layer 121 is formed on the first substrate 110 and thin film transistor is disposed in the display area AA on the first buffer layer 121.

The first substrate 110 may be made of a foldable plastic material. For example, the first substrate 110 may include at least one of polyimide (PI), polyethylene terephthalate (PET), polyethylene naphthalate (PEN), polycarbonate (PC), polyethersulfone (PES), polyarylate (PAR), polysulfone (PSF), and cyclic-olefin copolymer (COC). However, the first substrate 110 of the present invention is not limited to such these plastic materials, but may be formed of a foldable thin glass.

The first buffer layer 121 protects the thin film transistor formed in a subsequent process from impurities such as alkali ions leaking from the first substrate 110 or blocks moisture from the outside. The first buffer layer 121 may be a single layer made of silicon oxide (SiOx) or silicon nitride (SiNx), or multi-layers thereof.

The thin film transistor is formed in each of the plurality of sub-pixels. The thin film transistor includes a semiconductor layer 111 formed in the sub-pixel on the buffer layer 121, a gate insulating layer 122 formed on the first substrate 110 on which the semiconductor layer 111 is formed, the gate electrode 112 formed on the gate insulating layer 122, a first interlayer insulating layer 124 formed on the first substrate 110 to cover the gate electrode 112, and a source electrode 114 and a drain electrode 116 on the first interlayer insulating layer 124 and to be respectively connected to the semiconductor layer 111 through a contact holes 114a and 116a formed in the first interlayer insulating layer 124.

The semiconductor layer 111 may be formed of an amorphous semiconductor such as amorphous silicon (a-Si), a crystalline semiconductor such as polycrystalline silicon (p-Si), or an oxide semiconductor such as indium gallium zinc oxide (IGZO). At this time, the semiconductor layer 111 includes a channel layer in the central region and doped layers on both sides of the channel layer, so that the source electrode 114 and the drain electrode 116 are respectively contacted with the doped layer.

The gate electrode 112 may be formed of the single layer or the multi layers made of a metal such as Cr, Mo, Ta, Cu, Ti, Al, or an Al alloy and the gate insulating layer 122 may be formed of a single layer made of an inorganic material such as SiOx or SiNx, or double inorganic layers including SiOx and SiNx. The interlayer insulating layer 124 may be formed of the single layer made of the inorganic material such as SiNx or SiOx or the multi layers thereof, but is not limited thereto.

The source electrode 114 and the drain electrode 116 may be made of Cr, Mo, Ta, Cu, Ti, Al, or an Al alloy, but is not limited thereto.

Although the driving thin film transistor has a specific structure in the figures and the above description, the driving thin film transistor of the present invention is not limited to the this structure, and any driving thin film transistor of any structure may be applied.

A first passivation layer 126 is formed over the first substrate 110 on which the thin film transistor is formed, and a planarization layer 129 is formed on the first passivation layer 126.

The first passivation layer 126 may be formed of the single layer made of the inorganic material or a plurality of layers made of the inorganic material and the organic material, and the planarization layer 129 is formed of the organic material such as photoacrylic, but is not limited thereto.

An organic light emitting device E is formed in the display area AA on the planarization layer 129 and connected to the drain electrode 116 of the driving thin film transistor through a contact hole 129a formed in the first passivation layer 126 and the planarization layer 129.

The organic light emitting device E includes a first electrode 152 connected to the drain electrode 116 of the driving thin film transistor through the contact hole 129a, an organic light emitting layer 154 formed on the first electrode 152, and a second electrode 156 formed on the organic light emitting layer 154.

The first electrode 152 is connected to the drain electrode 116 of the thin film transistor to receive the image signal from the outside. The first electrode 152 may be formed of a transparent metal oxide such as indium tin oxide (ITO) or indium zinc oxide (IZO). In the case of a top emission type display apparatus that emits light in an upward direction, the first electrode 152 may be formed of the transparent metal oxide and the metal layer thereunder. The metal layer may be formed of the metal such as Ca, Ba, Mg, Al, Ag, or an alloy thereof.

The second electrode 156 may be formed of the single layer or a plurality of layers made of the metal such as Ca, Ba, Mg, Al, Ag, or an alloy thereof. In the case of the top emission type display apparatus, the second electrode 156 may be formed to have a thin thickness through which light emitted from the organic light emitting layer 154 may pass.

The organic light emitting layer 154 is an R(red)-organic light emitting layer formed in the R-pixel to emit red light, a G(green)-organic light emitting layer formed in the G-pixel to emit green light, and a B(blue)-organic light emitting layer formed in the B-pixel to emit blue light. Further, the organic light emitting layer 154 may be a white organic light emitting layer formed over the entire display apparatus 100 to emit white light. When the organic light emitting layer 154 is the white organic light emitting layer, R, G, and B color filter layers are formed on the upper regions of the white organic light emitting layer in the R, G, and B pixels to convert white light emitted from the white organic light emitting layer into red light, green light, and blue light. The white organic light emitting layer may be formed by mixing a plurality of organic materials for emitting respectively monochromatic light of R, G, and B. Further, white organic light emitting layer may be formed by stacking a plurality of organic light emitting layers for emitting respectively monochromatic light of R, G, and B.

The organic light emitting layer may be made of the inorganic light emitting material other than the organic light emitting material, for example, quantum dots.

The organic light emitting layer 154 includes not only the light emitting layer, but also an electron injection layer and a hole injection layer for respectively injecting electrons and holes into the light emitting layer, and an electron transport layer and a hole transport layer for respectively transporting the injected electrons and holes to the organic light emitting layer 154.

A bank layer 132 is formed in the boundary region of the pixel on the planarization layer 129. The bank layer 132 is a type of barrier rib, which partitions each pixel to prevent light of a specific color output from the pixel from being mixed with light of another color output from the adjacent pixel.

Although a part of the bank layer 132 is formed on the first electrode 152 in the figure, the bank layer 132 may be formed only on the planarization layer 129 and the first electrode 152 may be formed on the side of the bank layer 132. When the first electrode 152 extends on the side surface of the bank layer 132, since the first electrode 152 is also formed in the edge region of the boundary between the bank layer 132 and the planarization layer 129, the signal is also applied to the organic light emitting layer 154 in this edge region, so that the light is also emitted from the organic light emitting layer 154 in this edge region and thus the image can be displayed in this region. As a result, it is possible to minimize the non-display region within the pixel in which the image is not displayed.

An encapsulation layer EN is formed on the light emitting device E and the bank layer 132. The encapsulation layer EN includes a first encapsulation layer 142 made of the inorganic material, a second encapsulation layer 144 made of the organic material, and a third encapsulation layer 146 made of the inorganic material.

In this case, the inorganic material may include SiNx and SiOx, but is not limited thereto. The organic material may include polyethylene terephthalate, polyethylene naphthalate, polycarbonate, polyimide, polyethylene sulfonate, polyoxymethylene, polyarylate, or mixtures thereof, but is not limited thereto, A partition wall 134 having a set width may be formed on the upper surface of the bank layer 132 between the pixels. The partition wall 134 blocks air and moisture penetrating through the interface between the bank layer 132 and the first encapsulation layer 142. The partition wall 134 may include the single layer made of the inorganic material or the organic material, or a plurality of layers made of the inorganic layer and the organic layer.

A dam 136 is disposed on the first substrate 110 of the non-display area NA to surround the display area AA. The dam 136 may have a stacked structure of the first buffer layer 122, the gate insulating layer 124, and the first interlayer insulating layer 126, but is not limited thereto. When the organic material is coated to form the second encapsulation layer 144, the dam 136 prevents the coated organic material from flowing into the outer region of the display apparatus 100. In addition, when the crack is generated in the side surface of the display apparatus 100, the dam 136 may block propagation of the crack into the display area AA.

The second encapsulation layer 144 and the third encapsulation layer 146 are extended to the non-display area NA, but do not reach the dam 136. On the other hand, the first encapsulation layer 142 is extended beyond the side and top surfaces of the dam 136 to the outer edge of the dam 136.

In the figure, two dams 136 are formed, but only one dam 136 may be formed or three or more dams 136 may be formed.

A transparent adhesive 148 is coated in the display area AA and the non-display area NA on the encapsulation layer EN to attach a second substrate 160 onto the first substrate 110. The adhesive 148 may include a thermosetting resin, a photo curable resin, or the like, but is not limited thereto.

The adhesive 148 not only attaches the first substrate 110 and the second substrate 160 together, but also serves as another encapsulation layer to minimize penetration of moisture into the organic light emitting display apparatus. Therefore, although the term of reference numeral 148 is expressed as an adhesive in the detailed description of the present invention, this is for convenience, and the adhesive may be referred to as a filler or a fourth encapsulation layer.

The second substrate 160 is an encapsulation cap for encapsulating the organic light emitting display apparatus. A protect film such as a polystyrene (PS) film, a polyethylene (PE) film, a polyethylene naphthalate (PEN) film, or a polyimide (PI) film may be used as the second substrate 160.

A touch sensor T is disposed on the second substrate 160. The touch sensor T includes a second buffer layer 172 on the third encapsulation layer 146, a bridge 174 on the second buffer layer 172, a second interlayer insulating layer 173 on the bridge 174, a first touch electrode 176a and a second touch electrode 176b on the second interlayer insulating layer 173, and a protect layer (i.e., second passivation layer) 175 on the first touch electrode 176a and the second touch electrode 176b.

The second buffer layer 172 and the second interlayer insulating layer 173 may be made of the inorganic material such as SiOx or SiNx, but are not limited thereto. In addition, the protect layer 175 may be made of the organic material such as photo acrylic, but is not limited thereto.

A contact hole 173a is formed in the second interlayer insulating layer 173, and the first touch electrode 176a disposed on the second interlayer insulating layer 173 is connected to the bridge 174 disposed on the second buffer layer 172 through the contact hole 173a, so that a plurality of first touch electrode 176a arranged in the first direction (i.e., y-direction) on the second buffer layer 172 are electrically connected for each other.

While not shown in figures, a connection pattern is formed on the second interlayer insulating layer 173, so that a plurality of second touch electrode arranged in the second direction (i.e., x-direction) perpendicular to the first direction are electrically connected for each other.

A plurality of crack blocking openings 178 are formed in the second buffer layer 172 and the second interlayer insulating layer 173 of the non-display area NA. The crack blocking opening 178 is formed along the periphery of the display apparatus 100 in the predetermined width to block the propagation of the crack generated at the cut surface of the display apparatus to the display area AA when the outside of the display apparatus is cut.

Figure 6:
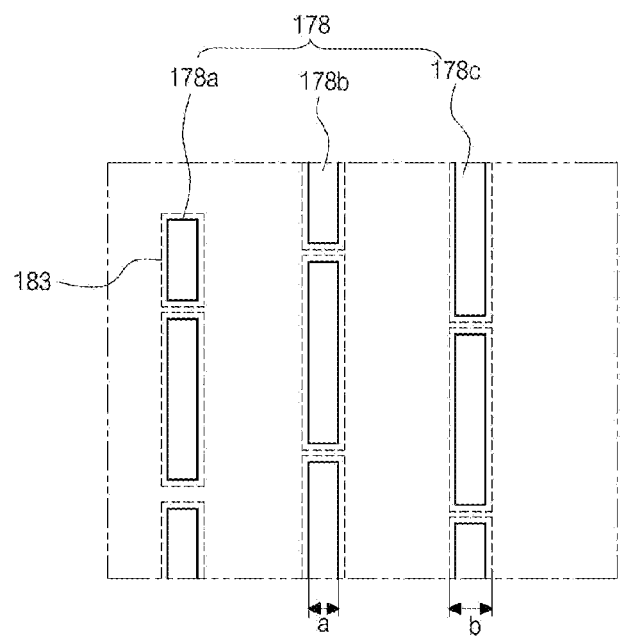
FIG. 6 is an enlarged view of area A of FIG. 4.

FIG. 6 is the enlarged view of area A of FIG. 4 and showing the crack blocking opening 178.

As shown in FIG. 6, the crack blocking opening 178 includes a first crack blocking opening 178a, a second crack blocking opening 178b, and a third crack blocking opening 178c formed along the outer periphery of the display apparatus. Each of the crack blocking openings 178a, 178b, and 178c includes a plurality of openings spaced apart from each other by a predetermined distance along the outer periphery. In this case, since cracks can propagate in the spaced area between the crack blocking openings 178a, 178b, and 178c, the spaced areas of the crack blocking openings 178a, 178b, and 178c adjacent to each other are formed to cross from each other (i.e., not to be aligned with each other). Thus, at least one crack blocking opening 178a, 178b, and 178c is always disposed toward the display area AA direction from the side cross-section of the display apparatus 100 to reliably block the propagation of cracks.

Although the crack blocking openings 178a, 178b, and 178c are formed in the second buffer layer 172 and the second interlayer insulating layer 173 in the figure, the crack blocking openings 178a, 178b, 178c can be formed in the second buffer layer 172, the second interlayer insulating layer 173, and the protect layer 175.

Referring back to FIG. 5, the polarizing plate 184 is disposed on the touch sensor T and attached to the touch sensor T by an adhesive 182. The polarizing plate 184 prevents reflection of light input from the outside to improve visibility of the display apparatus 100. The polarizing plate 184 transmits only light in a specific polarization direction among external light incident from the outside and absorbs the remaining light. The external light passing through the polarizing plate 184 is reflected inside the display apparatus 100 and then is incident on the polarizing plate 184 again. At this time, since the polarization direction of the reflected external light is changed, the light incident back to the polarizing plate 184 is absorbed by the polarizing plate 184 and not output to the outside, so that it is possible to prevent the reflection of external light.

The polarizing plate 184 may be a circular polarizing plate. When the circular polarizing plate is used, a retardation film of 214 may be further provided under the polarizing plate 184.

The polarizing plate 184 is made of a polymer film mainly composed of a polyvinyl alcohol (PVA) based resin containing an iodine or a dichroic dye and protective films on both sides thereof. At this time, the iodine or the dichroic dye is uniaxially stretched so that the iodine or the dichroic dye is oriented in one direction. In addition, the polarizing plate 184 may be made of material other than the PVA-based resin. For example, an O-type polarizing material in which a liquid crystal composition containing a dichroic material and a liquid crystal compound is oriented in a predetermined direction can be used as the polarizing plate 184. An E-type polarizer in which a lyotropic liquid crystal is aligned in a predetermined direction may be also used as the polarizing plate 184.

The protective film of the polarizing plate 184 is made of the transparent film without phase delay to protect the polymer film from external moisture or contamination. For example, the protective film may be made of triacetyl cellulose (TAC), polyethylene terephthalate (PET), cycloolefin polymer (COP), or a combination thereof.

The adhesive 182 is a transparent optical adhesive. As the adhesive 182, OCA (Optical Clear Adhesive) is mainly used, but is not limited thereto, and OCR (Optical Clear Resin) or PSA (Pressure Sensitive Adhesive) may be used.

A shielding member, for example, a gas shielding tape 183 is disposed in the region corresponding to the crack blocking opening 178a, 178b, 178c on the protect layer (i.e., second passivation layer) 175. The gas shielding tape 183 blocks gas and moisture flowing into the polarizing plate 184 through the crack blocking openings 178a, 178b, and 178c.

The gas and the moisture may be generated when the display apparatus 100 is driven for a long time. For example, the NH3 gas and the moisture may be generated in the first encapsulation layer 142 and the third encapsulation layer 146 made of the inorganic material such as SiNx when the display apparatus 100 is driven for the long time.

The generated gas and moisture reach the polarizing plate 184 through the crack blocking openings 178a, 178b, and 178c formed in the touch sensor T. These gases and moisture lower the adhesive force of the adhesive 182 for attaching the polarizing plate 184 to the touch sensor T, thereby causing a defect in which the polarizing plate 184 is lifted in the corresponding area. In addition, the polarizing plate 184 may be faded by the reached gas and moisture.

Since the lifting or color fading of the polarizing plate 184 causes light leakage through the polarizing plate 184, the luminance uniformity of the display apparatus 100 is reduced or defects such as spots occur.

In the present invention, it is possible to prevent defects caused by the gas and the moisture generated in the inorganic film by disposing the gas shielding tape 183 on the second passivation layer 175. The crack blocking opening 178 may be disposed along an edge of the touch sensor T. The gas shielding tape 183 may be disposed along the edge of the touch sensor T to shield the crack blocking opening 178.

Figure 7:
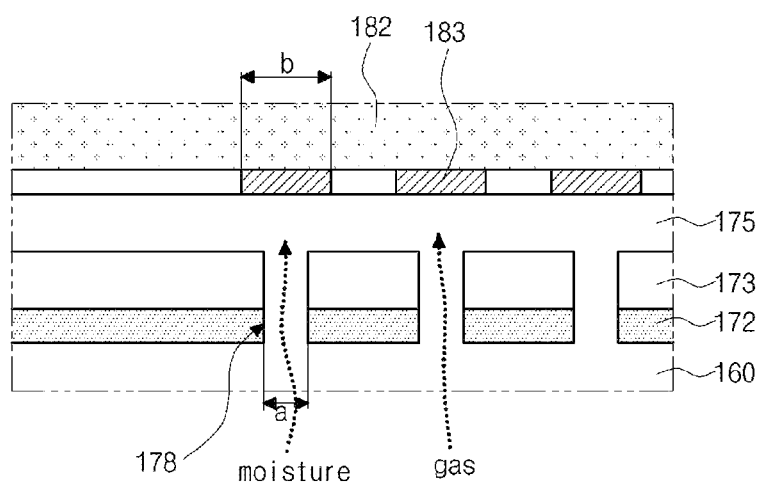
FIG. 7 is the enlarged view of area B of FIG. 5.

FIG. 7 is an enlarged view of area B of FIG. 5. The gas shielding tape 183 will be described in detail with reference to FIGS. 6 and 7.

As shown in FIGS. 6 and 7, the crack blocking openings 178a, 178b, and 178c are formed in the second buffer layer 172 and the second interlayer insulating layer 173 along the outer periphery of the non-display area NA of the display apparatus 100. Each of the crack blocking openings 178a, 178b, and 178c includes one or more cracks disposed in the short axis direction of the display apparatus 100, for example, the inner direction from the outer surface of the display apparatus 100. In this case, the distance between the crack blocking openings 178a, 178b, and 178c may be the same or different. The crack blocking openings 178a, 178b, and 178c may all have the same width or may have different widths.

The gas shielding tape 183 is formed on the second protective layer 175. At this time, the gas shielding tape 183 is aligned with the lower crack blocking openings 178a, 178b, and 178c. The width b of the gas shielding tape 183 is larger than the width a of each of the crack blocking openings 178a, 178b, and 178c (b>a). In addition, since the length of the gas shielding tape 183 is also larger than that of each of the crack blocking openings 178a, 178b, and 178c, the crack blocking openings 178a, 178b, and 178c are completely covered with the gas shielding tape 183.

Since the crack blocking openings 178a, 178b, and 178c are completely blocked by the gas shielding tape 183, the moisture and the gas, which are generated in the inorganic insulating layer such as the first encapsulation layer 142 and the third encapsulating layer 146 and penetrated to the upper polarizing plate 184 through the crack blocking openings 178a, 178b, and 178c, can be blocked completely.

The gas shielding tape 183 is made of the metal such as Al, but the present invention is not limited thereto and may be made of various materials.

In the present embodiment, the gas shielding tape 183, which is made of the tape form, is attached on the upper surface of the touch sensor T, for example, the upper surface of the second passivation layer 175. Thereafter, the polarizing plate 184 having lower surface coated with the adhesive is disposed on the gas shielding tape 183, and then the adhesive is hardened. The gas shielding tape 183 may include a metal pattern formed on the upper surface of the second passivation layer 175.

However, the present invention is not limited to this structure, and the gas shielding tape 183 may be formed by depositing the metal such as Al by a sputtering method and then etching the deposited metal on the second passivation layer 175.

As described above, in the display apparatus 100 according to the present invention, since the opening is formed along the periphery of the non-display area NA in the touch sensor T, the propagation of the cracks generated during the cut processing of the display apparatus 100 into the display area can be blocked.

In the display apparatus 100 according to the present invention, further, it is possible to block moisture and the gas generated from the inorganic layer from penetrating into the polarizing plate through the opening by depositing the tape above the openings, so that the deterioration such as the lift-off and the color fade of the polarizing plate can be prevented.

Figure 8:
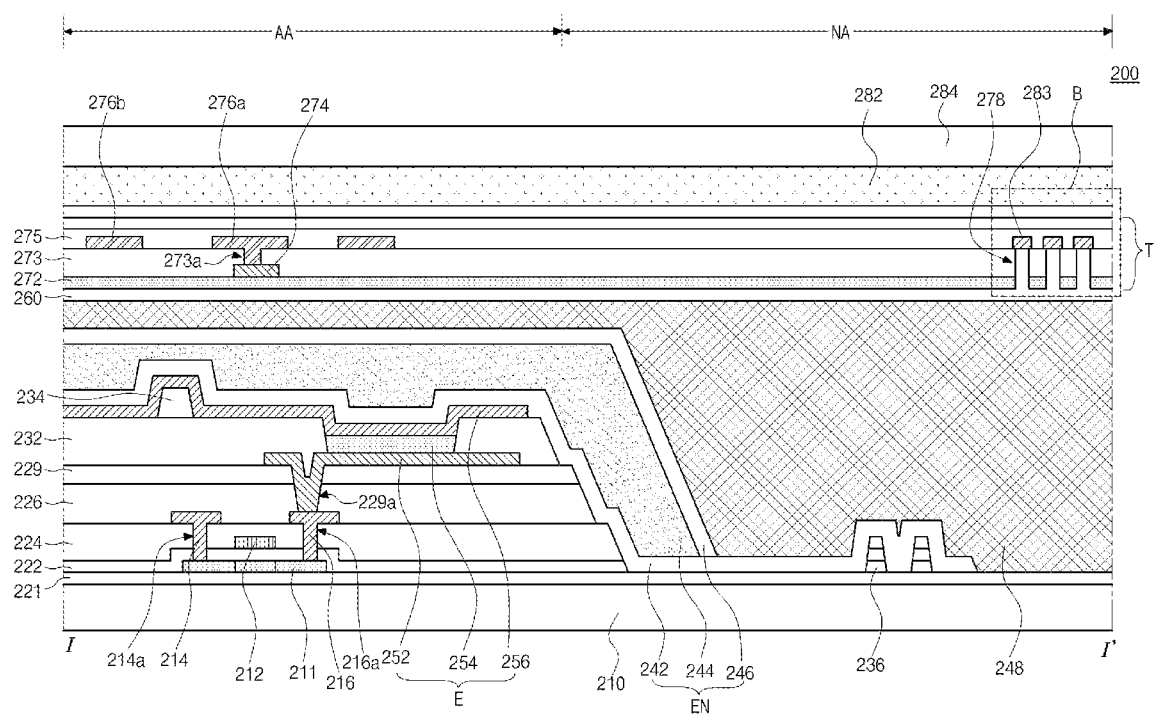
FIG. 8 is the cross-sectional view of the display apparatus according to a second exemplary embodiment of the present invention.

FIG. 8 is a cross-sectional view of the display apparatus 200 according to a second embodiment of the present invention. In this case, descriptions of the same components as those of the first embodiment will be omitted or simplified, and only other components will be described in detail.

As shown in FIG. 8, the display apparatus 200 of this embodiment includes the display panel, the touch sensor T disposed on the display panel, and the polarizing plate 284 disposed on the touch sensor T.

The display panel includes the thin film transistor and the organic light emitting device E over the thin film transistor in the display area AA on the first substrate 210.

The thin film transistor includes the semiconductor layer 211 formed in the pixel on the buffer layer 221, the gate insulating layer 222 formed on the first substrate 210 on which the semiconductor layer 211 is formed, the gate electrode 212 disposed on the gate insulating layer 222, the first interlayer insulating layer 224 over the first substrate 210 to cover the gate electrode 212, and the source electrode 214 and the drain electrode 216 connected respectively to the semiconductor layer 211 through the contact holes 214a and 216a formed in the first interlayer insulating layer 224.

The organic light emitting device E is formed over the thin film transistor. The organic light emitting device E includes a first electrode 252 connected to the drain electrode 216 of the thin film transistor through the contact hole 229a, the organic light emitting layer 254 on the first electrode 252, and the second electrode 256 on the organic light emitting layer 254.

The capsulation layer EN is formed over the organic light emitting device E to encapsulate the display panel. In this case, the capsulation layer EN includes the first capsulation layer 242 made of the inorganic material, the second capsulation layer 244 made of the organic material, and the third capsulation layer 246 made of the inorganic material.

The touch sensor T includes the second buffer layer 272 on the third encapsulation layer 246 of the display panel, the bridge 274 on the second buffer layer 272, the second interlayer insulating layer 273 on the bridge 274, the first and second touch electrodes 276a and 276b on the second interlayer insulating layer 273, and the passivation layer 275 on the first and second touch electrodes 276a and 276b.

A planarization layer 229 is formed on the first passivation layer 226. A bank layer 232 is formed in the boundary region of the pixel on the planarization layer 229. A partition wall 234 having a set width may be formed on the upper surface of the bank layer 232 between the pixels. A dam 236 is disposed on the first substrate 210 of the non-display area NA to surround the display area AA. A transparent adhesive 248 is coated in the display area AA and the non-display area NA on the encapsulation layer EN to attach a second substrate 260 onto the first substrate 210. The polarizing plate 284 is disposed on the touch sensor T and attached to the touch sensor T by an adhesive 282.

A plurality of crack blocking openings 278 are formed in the second buffer layer 272 and the second interlayer insulating layer 273 of the non-display area NA, so that the propagation of the crack generated at processed surface is blocked when the outer surface of the display apparatus is processed.

A shielding member, for example, a gas shielding pattern 283 is disposed on the second interlayer insulating layer 273. The gas shielding pattern 283 may be the metal pattern formed on the second interlayer insulating layer 273. The crack blocking openings 278 are totally covered with the gas shielding pattern 283 and thus the penetration of the gas and the moisture through the crack blocking openings 278 is blocked, so that lift off and color fading of the polarizing plate 284 can be prevented.

The gas shielding pattern 283 may be formed by the various processes using the various materials. For example, the gas shielding pattern 283 may be formed on the second interlayer insulating layer 273 by the same process using the same metal as the first touch electrode 276a and the second touch electrode 276b, but is limited thereto. The gas shielding pattern 283 can also be formed by other processes with other materials.

The features, structures, effects, etc. described in the example of the application are included in at least one example of the application, and are not necessarily limited to one example. Furthermore, the features, structure, effects, etc. exemplified in at least one example of the application can be combined or modified with other examples by a person having general knowledge of the field to which the application belongs. Therefore, the contents related to these combinations and modifications should be interpreted as being included in the scope of the application.

The present application described above is not limited to the above-described embodiment and the accompanying drawings. It will be apparent to those skilled in the art that various substitutions, modifications and changes are possible without departing from the technical matters of the present application. Therefore, the scope of the present application is indicated by the following claims, and all changes or modifications derived from the meaning and scope of the claims and their equivalent concepts should be construed as being included in the scope of the present application.

What is claimed is:

1. A display apparatus comprising:
   a substrate including a display area and a non-display area;
   a thin film transistor in the display area;
   a first passivation layer over the thin film transistor;
   a planarization layer on the first passivation layer;
   a light emitting device on the first passivation layer, the light emitting device including a first electrode, a light emitting layer on the first electrode, and a second electrode on the light emitting layer;
   at least one dam in the non-display area;
   an encapsulation layer covering the light emitting device, the encapsulation layer including a first encapsulation layer made of an inorganic material, a second encapsulation layer made of an organic material on the first encapsulation layer, and a third encapsulation layer made of an inorganic material on the second encapsulation layer;
   an adhesive over the encapsulation layer;
   a touch sensor on the adhesive, the touch sensor including a buffer layer on the adhesive, a bridge on the buffer layer, an interlayer insulating layer on the bridge, a first touch electrode and a second touch electrode on the interlayer insulating layer, and a second passivation layer over the first touch electrode and the second touch electrode;
   at least one crack propagation blocking member formed in the buffer layer and the interlayer insulating layer; and
   a gas blocking member formed on the interlayer insulating layer to cover the at least one crack propagation blocking member;
   wherein the first encapsulation layer and the third encapsulation layer extend to the non-display area and cover the at least one dam, and
   wherein a side surface of the encapsulation layer is slanted in the non-display area and the adhesive is formed in the slanted side surface of the encapsulation layer.

2. The display apparatus of claim 1, wherein the gas blocking member is a metal pattern formed on the interlayer insulating layer.

3. The display apparatus of claim 2, wherein the metal pattern is made of a same metal as the first touch electrode and the second touch electrode.

4. The display apparatus of claim 1, wherein the at least one crack propagation blocking member is disposed along an edge of the touch sensor.

5. The display apparatus of claim 4, wherein the gas blocking member is disposed along the edge of the touch sensor to shield the at least one crack propagation blocking member.

6. The display apparatus of claim 5, wherein a width of the gas blocking member is larger than a width of the at least one crack propagation blocking member to cover the at least one crack propagation blocking member completely.

7. The display apparatus of claim 1, wherein the at least one crack propagation blocking member each includes one or more cracks disposed in the display apparatus.

8. The display apparatus of claim 1, wherein a length of the gas blocking member is greater than a length of at least one opening to cover the at least one opening completely.

9. The display apparatus of claim 1, wherein the at least one crack propagation blocking member is formed along a periphery of the non-display area.

10. The display apparatus of claim 1, wherein the at least one crack propagation blocking member includes a first crack blocking opening, a second crack blocking opening, and a third crack blocking opening formed along an outer periphery of the display apparatus, and wherein each of the first, second and third crack blocking openings includes a plurality of openings spaced apart from each other by a predetermined distance along the outer periphery of the display apparatus.

11. The display apparatus of claim 10, wherein spaced areas of the first, second and third the crack blocking openings adjacent to each other are formed not to be aligned with each other.

* * * * *